United States Patent
Gehrig

[11] 4,045,685
[45] Aug. 30, 1977

[54] MOS POWER STAGE FOR GENERATING NON-OVERLAPPING TWO-PHASE CLOCK SIGNALS

[75] Inventor: Wilfried W. Gehrig, Freiburg im Breisgau, Germany

[73] Assignee: ITT Industries, Incorporated, New York, N.Y.

[21] Appl. No.: 736,917

[22] Filed: Oct. 29, 1976

[30] Foreign Application Priority Data

Dec. 17, 1975 Germany .............................. 2556735

[51] Int. Cl.[2] .......................... H03K 1/18; H03K 5/15; H03K 5/156; H03K 5/04
[52] U.S. Cl. ................................ 307/208; 307/220 R; 307/265; 307/269
[58] Field of Search ............... 307/205, 208, 215, 251, 307/220 R, 220 C, 225 R, 225 C, 265-269, 279

[56] References Cited

U.S. PATENT DOCUMENTS

| | | | |
|---|---|---|---|
| 3,479,603 | 11/1969 | Overstreet, Jr. | 307/208 X |
| 3,536,936 | 10/1970 | Rubinstein et al. | 307/265 X |
| 3,641,366 | 2/1972 | Fujimoto | 307/205 X |
| 3,777,184 | 12/1973 | Smith | 307/265 X |
| 3,805,167 | 4/1974 | Nash et al. | 307/265 X |
| 3,870,962 | 3/1975 | D'Errico | 307/208 X |
| 3,986,046 | 10/1976 | Wunner | 307/293 X |

Primary Examiner—John S. Heyman
Assistant Examiner—Larry N. Anagnos
Attorney, Agent, or Firm—John T. O'Halloran; Peter C. Van Der Sluys; Vincent B. Ingrassia

[57] ABSTRACT

This relates to an MOS power stage of a two-phase clock signal generator arranged on the same integrated circuit chip as the circuit to be driven. The generator consists of one MOSFET inverter, the output of which is multiplexed by the two clock signals. In this manner, power loss in the MOSFET is reduced.

6 Claims, 5 Drawing Figures

MOS POWER STAGE FOR GENERATING NON-OVERLAPPING TWO-PHASE CLOCK SIGNALS

BACKGROUND OF THE INVENTION

One main class of integrated MOS circuits are the so-called two-phase circuits, i.e. circuits for the operation of which non-overlapping clock signals are required, cf. the book by D. Becker and H. Mäder "Hochintegrierte MOS-Schaltungen", Stuttgart, 1972, pp. 60 to 71. As a rule, such circuits exclusively consist of MOSFETs, an abbreviation standing for "metal oxide semiconductor field-effect transistor" which, however, are at present no longer restricted exclusively to field effect transistors having a layer of oxide for serving as the insulating layer lying below the gate terminal. Other insulating layer materials have become known.

From the aforementioned book it is also known to arrange the oscillator for generating the two clock signals on the same semiconductor chip as the MOS-circuit to be driven by the two clock signals. The clock signal generator consists of a suitable oscillator circuit generating a square wave signal with a pulse duty factor of less than 0.5, and of an interconnecting and power output stage forming the two non-overlapping clock signals from this square wave signal.

Quite depending on the size and complexity of the integrated MOS circuit which, according to the present state of art, permits realization of a maximum chip surface area of about 20 mm$^2$, with up to ten thousand MOS-FET's being arranged on this surface area, a considerable power loss is converted in the power output stage of the clock signal generator.

SUMMARY OF THE INVENTION

It is the object of the invention to provide an MOS power stage in which the occurring power loss is considerably reduced compared to that in the power output stage according to the prior art so that the semiconductor chip is heated considerably less than in the former arrangement.

According to a broad aspect of the invention, there is provided an MOS-power stage for generating non-overlapping two-phase clock signals from a first square wave signal having a pulse duty factor less than 0.5, comprising: a power inverter coupled to said square wave signals; first and second transistors each having a main current path coupled to the output of said power inverter; first and second capacitors, said first transistor having a gate coupled to its main current path via said first capacitor, and said second transistor having a gate coupled to its main current path via said second capacitor; and means for coupling the gate terminals of said first and second transistors to one of two inversely related auxiliary square wave signals, each having a pulse duty factor of 0.5 and a frequency equal to substantially half the frequency of said first square wave signal.

The above and other objects of the present invention will be more clearly understood from the following detailed description taken in conjunction with the accompanying drawings, in which:

DESCRIPTION OF THE PREFERRED EMBODIMENT

Figure 1:
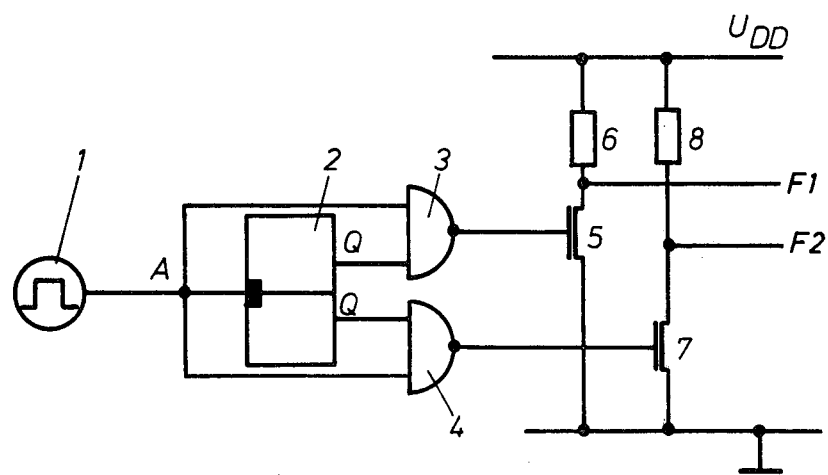
FIG. 1 shows a power output stage according to the prior art.

FIG. 1 shows a power output stage. The clock signal generator 1 feeds the binary frequency divider stage 2 and one input of the NAND-gates 3, 4 with the respective other input thereof being controlled by the two outputs of the binary frequency divider stage 2. The output of the NAND-gate 3 is applied to the gate terminal of the MOS power transistor 5 whose main current path is connected on one hand to the zero point of the circuit and, on the other hand, via the diffused resistor 6, to the supply voltage $U_{DD}$. In the same way, the output of the NAND-gate 4 controls the MOS power transistor 7 with the diffused resistor 8. At the point connecting the transistor 5 and the resistor 6 there is taken off the clock signal F1 and at the point connecting the transistor 7 and the resistor 8 there is taken off the clock signal F2.

Figure 2:
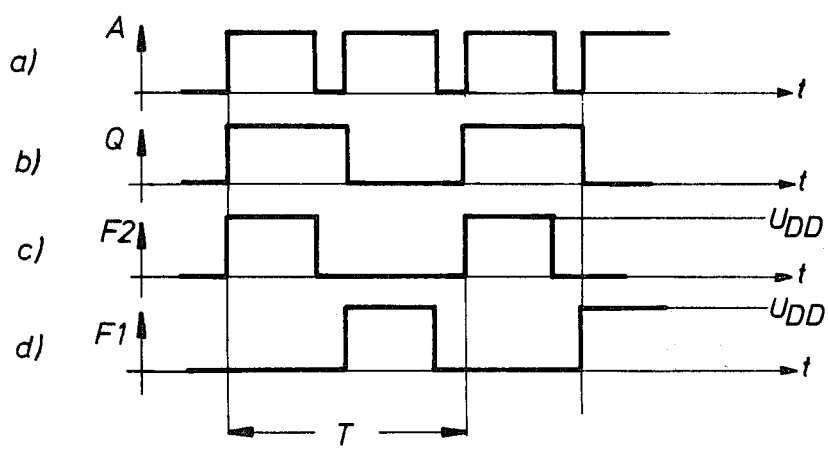
FIGS. 2a-2d are waveforms appearing at points in the circuit of FIG. 1.

FIG. 2a shows the curve as a function of time relating to the square wave output signal of the clock signal generator 1 whose pulse duty factor is smaller than 0.5, hence in the present case 0.25. FIG. 2b shows the output signal Q of the binary frequency divider stage 2 whose frequency, as is recognizable, is half as high as the frequency of the square wave signal A. FIGS. 2c, 2d show the two clock signals F1, F2 lasting for the period T.

As may be seen from these two drawings, each of the power transistors 5, 7 is rendered non-conductive during 3T/8, i.e. the clock signals F1, F2 practically assume the value of $U_{DD}$ during this period of time. During 5T/8, however, the power transistors 5, 7 are rendered conductive, i.e. the clock signals F1, F2 assume substantially the potential of the zero point of the circuit. Accordingly, during the time 5T/8 a current flows in the transistors 5, 7 and there results the aforementioned power loss.

Figure 3:
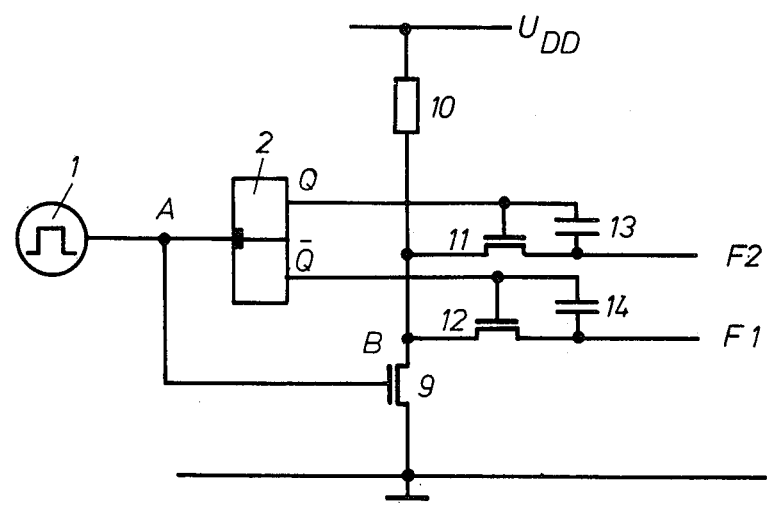
FIG. 3 shows a first example of embodiment of the invention.

In the embodiment according to FIG. 3, the clock signal generator 1 controls the gate terminal of the MOS-power transistor 9, whose main current path is connected on one hand to the zero point of the circuit and, on the other hand, via the diffused resistor 10 to the supply voltage $U_{DD}$. Moreover, the output of the clock signal generator 1 is connected to the input of the binary frequency divider stage 2, so that at the outputs Q, $\overline{Q}$ thereof there will appear two auxiliary square wave signals which are inverse in relation to one another, having a pulse duty factor of 0.5, and with the frequency thereof being equal to half the frequency of the square wave signal generated by the clock signal generator 1. In the embodiment according to FIG. 3, the binary frequency divider stage 2 consists of a usual type of frequency divider flip flop.

To the point B connecting the MOS- power transistor 9 and the diffused resistor 10, hence to the output of the MOS power inverter as constituted by the transistor 9 and the resistor 10, there are connected the main current paths of the MOS transistors 11, 12 whose respective gate terminal is connected via the capacitor 13 or 14 to the associated end of the main current path distant from the inverter and forming the output of the respective clock signal F1, F2. The aforementioned gate terminals are connected to the outputs Q, $\overline{Q}$ of the binary frequency divider stage 2, i.e. the gate terminal of transistor 11 is applied to the output Q, and the gate terminal of transistor 12 is applied to the output $\overline{Q}$.

FIG. 4a again shows the output signal of the clock signal generator 1, and FIG. 4b shows the output signal of the MOS power inverter at point B. It is evident that these two signals are inverse in relation to one another. FIG. 4c shows the output signal $\overline{Q}$ of the binary frequency divider stage 2, and FIGS. 4d, 4e show the non-overlapping clock signals F1, F2.

The clock signal F1 results from both the signal as appearing at point B and the signal $\overline{Q}$ as follows: At the beginning $t_1$ of the period T, the MOS power transistor 9 is driven into saturation by the clock signal generator 1, so that the voltage at the inverter output B practically drops to the potential at the zero point of the circuit (FIG. 4b). Since, when disregarding the switching delay as occurring in the binary frequency divider stage 2 for the time being, the voltage at the output $\overline{Q}$ substantially simultaneously assumes its maximum positive value (FIG. 4c), the MOS transistor 12 is likewise switched to the conducting state so that now the output of the clock signal F1 likewise assumes the potential of the zero point of the circuit.

When the MOS power transistor 9 is again rendered non-conductive by the square wave signal of the clock signal generator 1 at the time position $t_2$, the potential at the output B of the power inverter is likewise raised to the level of the supply voltage $U_{DD}$ thus causing this potential, owing to the conducting transistor 12, to appear also at the output for the clock signal F1 (FIG. 4d).

This state is maintained until the MOS transistor 9 is again switched to the conducting state by the square wave signal of the clock signal generator 1 at the time position $t_3$, so that the potential at the output B is again lowered to the zero point of the circuit (FIG. 4b). Since, at this time position, the binary frequency divider stage is switched into its respective other state with this, however, being effected with the aforementioned switching time delay, the signal at the output $\overline{Q}$ drops off with a time delay, so that the MOS transistor 12 is only rendered non-conducting after the potential at the output B has dropped. In this way, this lowering of the potential at point B still reaches the output for the clock signal F1, so that the latter will likewise assume the potential of the zero point of the circuit.

The switching to the non-conducting state of the MOS power transistor 9 at the time position $t_4$ and, consequently, the rise of the potential at point B have no effect upon the clock signal F1, because the MOS-transistor 12 remains to be in the non-conducting state until the MOS-transistor 9 is again switched to the conducting state. For this reason, the clock signal F1 remains at the potential of the zero point of the circuit until the MOS-transistor 9 at the end $t_5$ of the period T is again rendered non-conducting. Accordingly, the period T is equal to double the period $t_3 - t_1$ of the square wave signal A. Now the sequence of the mode of operation is started again from the beginning.

Controlling the MOS-transistor 11 via the output Q of the binary frequency divider stage 2 and, consequently, generating the clock signal F2, are effected in an analogous way, merely staggered by half the period T, so that there will result a waveform as shown in FIG. 4e.

Instead of using a frequency divider flip flop as the binary frequency divider stage, it is also possible to use other arrangements as long as they produce two inverse square wave signals having a pulse duty factor of 0.5. Thus, for example, it is possible to use a so-called Johnson counter as is known per se from the contents of pages 132 to 134 of the aforementioned book. The Johnson counter is a shift register whose output signal is coupled back to the input via an inverter. This is responsible for the property of the Johnson counter of having a counting capacity twice as high as the number of its stages.

When considering a total counting cycle starting from a position in which all stages are at the binary state "ZERO", binary "ONES" "move" from counting step to counting step "into" the individual stages from the input, and binary ZEROS will move "out" at the end until after half the counting steps, all stages are in the ONE state. Thereafter, the state of each stage is again changed from the input to a ZERO until after the last counting step all stages are again in the ZERO state.

When considering the change of state of each individual stage of the Johnson counter, it will be seen that in one stage during one counting cycle there will appear one single ZERO-ONE-change, and one single ONE-ZERO-change. This property makes the Johnson counter become suitable for the frequency-dividing purpose. By suitably tapping the states of the individual stages and by logic combination thereof, it is thus possible to derive pulses of different pulse duty factor including the 0.5 pulse duty factor, which are in a fixed relationship with the frequency of the clock signal of the Johnson counter.

Figure 5:
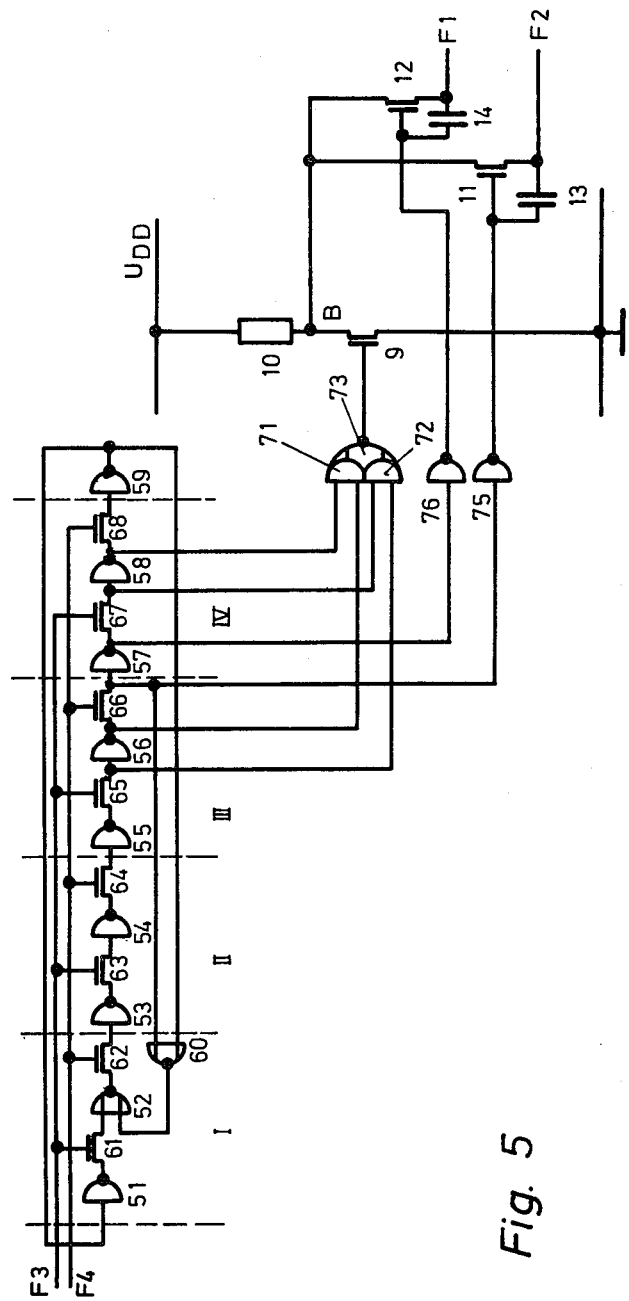
FIG. 5 shows a further example of embodiment of the invention.

These well known properties of the Johnson counter are used in the example of embodiment according to FIG. 5 for generating the auxiliary square wave signals which are inverse in relation to one another, as well as for generating the square wave signal controlling the MOS power inverter. In the example of embodiment according to FIG. 5 there is shown a four-stage (stages I . . . IV) Johnson counter. Each of these stages consists of two half-stages each containing an inverting gate with a subsequently connected coupling transistor. The first half-stage of the first stage I and the stages II to IV contain as the inverting gates the inverters 51 and 53 to 58, whereas the NOR-gate 52 is provided for in the second half-stage of the input stage I.

This NOR-gate, together with the NOR-gate 60 serves to secure the aforementioned intended mode of operation of the Johnson counter because feed-back type shift registers, as a rule, provide for several different counting cycles of which the unwanted ONES have to be suppressed. This is accomplished in the Johnson counter in that the output of the third stage III and the input of the first stage I are NOR-connected via the NOR-gate 60 to the input of the second half-stage of the first stage I.

The Johnson counter is controlled by means of the two-phase clock signals F3, F4, i.e. in such a way that the odd-numbered coupling transistors 61, 63, 65, 67 are operated at the clock signal F3 and the even numbered coupling transistors 62, 64, 66, 68 are operated at the clock signal F4. Accordingly, the total layout of the Johnson counter shown in FIG. 5, consists of the cyclical series connection of the circuit parts 51, 61; 52, 62; . . . 58, 68; 59 with the inverter 59 being the inverter causing the output to be fed back to the input.

The square wave signal controlling the MOS-power transistor 9, which corresponds to the square wave signal of the clock signal generator 1 in the arrangement according to FIG. 3, is generated in that the two inputs of the first AND-circuit 71 are each connected to the output of the inverters 56, 58 belonging to respectively the second half-stage of the stages III, IV of the Johnson counter i.e. the inputs of the AND-gate are each time connected to the output of two inverters belonging to the same half-stages of two successively following stages of the Johnson counter. The two inputs of the second AND-gate 72 are connected to the corresponding inputs of these inverters 56, 58. The outputs of the two AND-gates 71, 72 are interconnected by means of the NOR-gate 73 whose output is connected to the gate terminal of the MOS power transistor 9.

The gate terminals of the MOS-transistors 11, 12 as connected to the output B of the MOS-power inverter, are controlled by the outputs of the inverter stages 75, 76, with the inputs thereof being connected to the input or the output of the inverter 57 as arranged between the inverters 56, 58 respectively. By this tapping point as provided for on an inverter arranged between the two inverters controlling the inputs of the two AND-gates 71, 72 it is made sure that the mode of operation as obtained in the example of embodiment according to FIG. 3 by the switching time delay of the binary frequency divider stage, is also secured in this particular example of embodiment, namely that the MOS-power transistor 9 is each time driven into saturation shortly before the MOS-transistors 11, 12 are switched to the conducting state.

Figure 4:
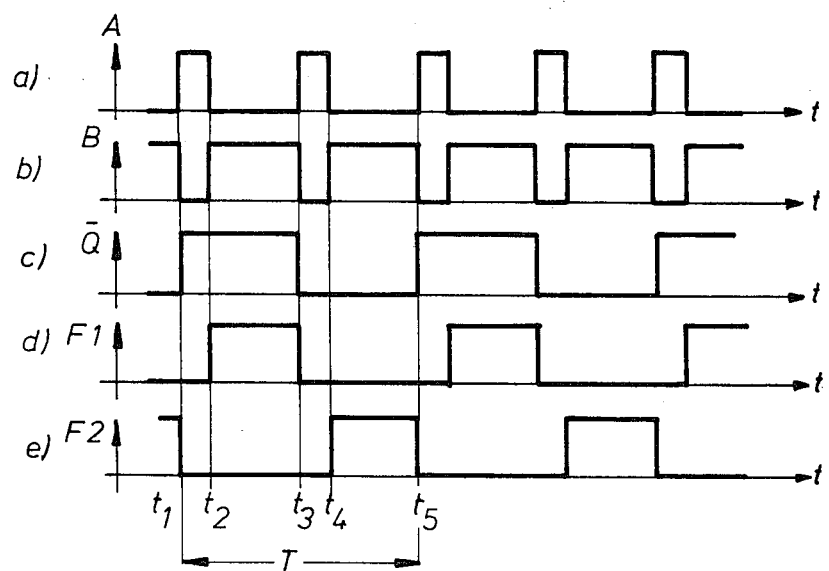
FIG. 4 shows waveforms as occurring in the arrangement according to FIG. 3.

In the second example of embodiment according to FIG. 5 there appear the same waveforms as shown in FIG. 4 with respect to the example of embodiment according to FIG. 3. The frequency of the Johnson counter clock signals F3, F4 is eight times higher than the frequency of the signals tapped at the inverter, and sixteen times higher than the frequency of the clock signals F1, F2.

In one realized MOS power stage the MOS power transistor 9 has a ratio of the channel zone width $w$ to the channel zone length 1 of $w1 = 100$, whereas the same value in the case of the MOS-transistors 11, 12 amounts to about 20. In relation thereto, the diffused resistor appears to have a resistance value of $18 \text{ k}\Omega \pm 35$ percent and is constituted by 225 surface elements having a surface resistance of $(80 \pm 30) \, \Omega/\square$.

When comparing FIG. 4b with FIGS. 2c, 2d it will be seen that the MOS-power transistor 9, according to the invention, is driven into saturation merely during $2T/8$, so that a power loss is caused in it merely during this period of time whereas, in distinction thereto, in the arrangement according to FIG. 1 and referred to T, a power loss is caused in two power transistors each time respectively during $5T/8$. Accordingly, compared to the hitherto employed arrangement, there will thus result a power loss reduction by the factor 5, i.e. in an integrated MOS circuit, employing the MOS-power stage according to the invention, there is only caused 20 percent of the power loss compared to that of the hitherto employed arrangement.

While the principles of this invention have been described above in connection with specific apparatus, it is to be understood that this description is made only by way of example and not as a limitation on the scope of the invention as set forth in the objects and features thereof and in the accompanying claims.

What is claimed is:

1. An MOS-power stage for generating non-overlapping two-phase clock signals from a first square wave signal having a pulse duty factor less than 0.5, comprising:
    a power inverter coupled to said square wave signals;
    first and second transistors each having a main current path coupled to the output of said power inverter;
    first and second capacitors, said first transistor having a gate coupled to its main current path via said first capacitor, and said second transistor having a gate coupled to its main current path via said second capacitor; and
    means for coupling the gate terminals of said first and second transistors to one of two inversely related auxiliary square wave signals, each having a pulse duty factor of 0.5 and a frequency equal to substantially half the frequency of said first square wave signal.

2. An MOS-power stage according to claim 1 wherein said auxiliary square wave signals are produced by a frequency divider stage coupled to said first square wave signal.

3. An MOS-power stage according to claim 2 wherein said frequency divider is a binary flip-flop.

4. An MOS-power stage according to claim 2 wherein said inverter comprises:
    a third transistor having a gate coupled to said first square wave signal; and
    a resistor coupled in series with the main current path of said third transistor.

5. An MOS-power stage according to claim 2 wherein said first square wave signal and said auxiliary square wave signals are generated by a Johnson counter.

6. An MOS-power stage according to claim 5 wherein said Johnson counter is a four-stage counter further including:
    a first AND-gate having inputs coupled to the third and fourth stage of said counter;
    a second AND-gate having inputs coupled to the third and fourth stages of said counter;
    a NOR-gate having inputs coupled to the outputs of said first and second AND-gates and an output for providing said first square wave signal; and
    first and second inverter stages, said first inverter stage coupled to the forth stage of said counter and said second inverter stage coupled to the third stage of said counter, the outputs of said first and second inverters providing said auxiliary square wave signals.

* * * * *